United States Patent [19]
Martin et al.

[11] Patent Number: 5,882,538
[45] Date of Patent: Mar. 16, 1999

[54] METHOD AND APPARATUS FOR LOW ENERGY ELECTRON ENHANCED ETCHING OF SUBSTRATES

[75] Inventors: Kevin P. Martin, Atlanta, Ga.; Harry P. Gillis, Los Angeles, Calif.; Dmitri A. Choutov, Marietta, Ga.

[73] Assignee: Georgia Tech Research Corporation, Atlanta, Ga.

[21] Appl. No.: 705,902

[22] Filed: Aug. 28, 1996

Related U.S. Application Data

[60] Provisional application No. 60/002,861, Aug. 28, 1995 and provisional application No. 60/002,837, Aug. 28, 1995 and provisional application No. 60/002,862, Aug. 28, 1995 and provisional application No. 60/020,629, Jun. 27, 1996 and provisional application No. 60/022,364, Jul. 24, 1996.

[51] Int. Cl.$^6$ .................................................. H05H 1/00
[52] U.S. Cl. ............................... 216/71; 216/66; 216/67; 216/68
[58] Field of Search ................................... 216/66, 67, 68, 216/71

[56] References Cited

U.S. PATENT DOCUMENTS

| | | | |
|---|---|---|---|
| 4,207,158 | 6/1980 | Freeman | 204/180 |
| 4,259,145 | 3/1981 | Harper | 156/643 |
| 4,450,787 | 5/1984 | Weakliem | 118/723 |
| 4,496,881 | 1/1985 | Cheever | 315/357 |
| 4,874,459 | 10/1989 | Coldren | 156/643 |
| 5,003,178 | 3/1991 | Livesay | 250/492.3 |
| 5,039,376 | 8/1991 | Zukotynski | 156/643 |
| 5,145,554 | 9/1992 | Seki | 156/643 |
| 5,368,676 | 11/1994 | Nagaseki | 156/345 |
| 5,457,298 | 10/1995 | Nelson | 219/121 |
| 5,497,053 | 3/1996 | Tang | 315/366 |

OTHER PUBLICATIONS

A.P. Webb & S. Veprek, Reactivity of Solid Silicon with Hydrogen Under Conditions of a Low Pressure Plasma, Chemical Physics Letter, 62 (1) p. 173 (1979).

S. Veprek & F.A. Sarott, Electron–Impact–Induced Anisotropic Etching of Silicon by Hydrogen, Plasma Chemistry & Plasma Processing, 2(3) p. 233 (1982).

H.P. Gillis, J.L. Clemons & J.P. Chamberlain, Low–Energy Electron Beam Enhanced Etching of Si(100)–(2×1) by Molecular Hydrogen, J.Vac. Sci. Technol. B 10(6), p. 2729 (1992).

H.P. Gillis et al., "Low Energy Electron–Enhanced Etching of GaN/Si in Hydrogen Direct Current Plasma", J. Electrochem Soc., vol. 143, No. 11, Nov. 1996.

H.P. Gillis, et al., "The Dry Etching of Group III–Nitride Wide–Bandgap Semiconductors"; Journal of Materials 38, 5D–55 (1996).

E. Wiberg et al., "Hydrides of the Elements of Main Groups I–IV", New York, 1971, Chapter 6, pp. 443–460.

P. Breisacher et al., "Comparative Stabilities of Gaseous Alane, Gallane, and Indane", Journal of American Chemical Society, pp. 4255–4258, 87:19, Oct. 5, 1965.

K. Choquette et al.,"Hydrogen Plasma Processing of GaAs and AlGaAs," J. Vac. Sci. Technol. B, vol. 11, No. 6, Nov./Dec. 1993, pp. 2025–2032.

J.R. Creighton, "Hydrogen Chemisorption and Reaction on GaAs(100)," J. Vac Sci. Technol. A8(6), Nov./Dec. 1990, pp. 3984–3987.

H.P. Gillis et al., "Highly Anisotropic, Ultra–Smooth Patterning of GaN/SiC by Low Energy Electron Enhanced Etching in DC Plasma", Journal of Electronic Materials, Mar. 1997 (Special Issue).

*Primary Examiner*—Ceila Chang
*Attorney, Agent, or Firm*—Thomas, Kayden, Horstemeyer & Risley, LLP.

[57] ABSTRACT

A method of low-damage, anisotropic etching of substrates including mounting the substrate upon the anode in a DC plasma reactor and subjecting the substrate to a plasma of low-energy electrons and a species reactive with the substrate. An apparatus for conducting low-damage, anisotropic etching including a DC plasma reactor, a permeable wall hollow cold cathode, an anode, and means for mounting the substrate upon the anode.

24 Claims, 2 Drawing Sheets

OTHER PUBLICATIONS

Heiji Watanabe et al., "Electron–beam–assisted Dry Etching For GaAs Using Electron Cyclotron Resonance Plasma Electron Source", Appl. Phys. Lett 61 (25), 21 Dec. 1992.

Veprek et al., "The Preparation of Thin Layers of Ge and Si By Chemical Hydrogen Plasma Transport", Solid State Electronics Pergamon Press 1968, vol. 11, pp. 683–684.

S. Veprek et al., "Parameters Controlling The Deposition of Amorphous and Microcrystalline Silicon in Si/H Discharge Plasmas", J. de Physique (Paris) 42, C4–251 (1981).

S. Veprek et al., "Highlights of Preparative Solid State Chemistry In Low Pressure Plasmas", Pure & Appln. Chemistry, vol. 54, No. 6, pp. 1197–1220, 1982.

H.P. Gillis et al., Low Energy Electron Enhanced Etching of Si(100) in Hydrogen/Helium Direct–Current Plasma, Appl. Phys. Lett 66 (19), 8 May 1995.

METHOD AND APPARATUS FOR LOW ENERGY ELECTRON ENHANCED ETCHING OF SUBSTRATES

RELATED APPLICATIONS

This application claims priority to and the benefit of the following U.S. Provisional Applications: Ser. No. 60/002,861, entitled "Low Energy Electron-Enhanced Etching of Si(100) in a Hydrogen/Helium Direct-Current Plasma," filed Aug. 28, 1995; Ser. No. 60/002,837, entitled "Low Energy Electron-enhanced Etching of GaAs(100) in a Chlorine/Hydrogen DC Plasma," filed Aug. 28, 1995; Ser. No. 60/002,862, entitled "Permeable Wall Hollow Cathode," filed Aug. 28, 1995; Ser. No. 60/020,629, entitled "Low Energy Electron Enhanced Etching of GaN in a Hydrogen DC Plasma," filed Jun. 27, 1996, and Ser. No. 60/022,364, entitled Permeable Wall Hollow Cathode," filed Jul. 24, 1996, each of which is incorporated herein by reference.

FIELD OF THE INVENTION

The present invention relates generally to the preparation of etched substrates. More particularly, the present invention relates to an improved process for low-damage, anisotropic etching of substrates such as semiconductors, and improved anisotropically etched substrates.

BACKGROUND OF THE INVENTION

Dry etching is an absolutely critical process in the fabrication of all micrometer and nanometer scale features on high speed electronic and opto-electronic devices. In brief, the fabrication of such chips and devices involves the following process. A substrate of some semiconductor or metal is selected and a pattern is laid down over it, the pattern having open areas in it. The overlying structure containing the pattern is sometimes called a mask. Etching chemistry is then performed through the open areas, which means that in effect some of the underlying material exposed through the open areas is dissolved away so that the pattern is transferred into the underlying layer(s). Then, the mask is stripped away and what is left behind is the original substrate, but now the pattern has been transferred into it. The process is similar to silk screening or stamping a pattern into material. The resulting pattern has a three dimensional structure.

In the early days of integrated circuit fabrication, most etching was done using a wet chemical process that is quite similar to conventional photography. For example, to etch an array of grooves in a silicon wafer, the water is first placed in a high temperature, oxidizing environment and a layer of silicon dioxide is grown on the top surface of the wafer. Then, the oxidized wafer is covered with a thin photosensitive layer of gelatinous organic material called a "photoresist". Next, a piece of material analogous to a photographic negative, called a "photomask", is placed over the photoresist. Ultraviolet light is shined through openings in this photomask. The ultraviolet light changes the solubility of the photoresist. Thus, areas of photoresist that have been illuminated with the ultraviolet light display a different solubility than areas which have not been exposed to the light. Finally, a solvent is used which dissolves away only the areas of the photoresist which have had their solubility increased by the ultraviolet light. At this point, the original pattern on the photomask has been transferred to the photoresist layer. Some people refer to this patterned photoresist layer as a "soft mask".

Subsequently, a wet chemical, hydrofluoric acid (HF) dip is used to dissolve away the silicon dioxide which has been exposed through each of the openings in the overlaying photoresist. Then, the photoresist is stripped off. At this point, it is apparent that the pattern originally appearing on the photomask has been transferred to the silicon dioxide layer overlying the silicon wafer. This patterned layer of silicon dioxide is sometimes referred to as a "hard mask".

Finally, the wafer is dipped into a caustic etch, such as potassium hydroxide (KOH) which etches away the silicon exposed under the openings in the hard mask. After stripping away the hard mask, the desired silicon wafer with the etched grooves remains.

As an alternative to following the hard masking step described above with a KOH silicon etch, ion implantation or high temperature diffusion could optionally be used to place dopant atoms through the openings in the hard mask.

Many other structural and chemical variations using the sorts of wet processing steps described above are possible and are well known to those of skill in the art. In each case however, the corresponding process suffers from a problem that is inherent with the associated etching using wet chemicals. In particular, at the same time that the wet chemistry is etching down into the wafer, it is also etching laterally under the mask. Indeed, this undesired lateral etching tends to extend approximately as far as the desired vertical etching. This tendency for wet chemical etching to proceed equally in all directions without prejudice is called "isotropic etching".

Isotropic etching is adequate for making a line that is 20 microns wide through a film that is 1 micron deep. The resulting inaccuracy in the edges of such a feature is a small percentage of the overall device structure; and therefore, it does not compromise performance. However, as smaller and smaller structures are fabricated, isotropic etching is inadequate. The industry is moving toward fabrication of structures with so called sub-micron features, which are essential for high speed computer chips, optical structures, and electronic and optoelectronic devices. In other words, the accurate transfer of a pattern which is half a micron wide into a material which is half a micron thick requires absolutely straight vertical side walls, or anisotropic etching. Isotropic etching is inadequate because the associated rounded undercut would be a very high percentage of the active device material and would destroy its performance.

Presently, it is thought that the only way to get straight side walls is by a technique called reactive-ion etching. Rather than dipping the device in wet chemicals, it is exposed to reactive gases and plasmas. Energetic ions formed in the plasma are accelerated in the normal direction to the substrate where they enhance the etching chemistry at the bottom of the open area defined by the mask and not on the sidewalls. Thus, straight side walls can be achieved with reactive-ion etching.

Reactive-ion etching provides anisotropic etching. However, the ions are heavy ions like argon or $CF_3^+$ and are traveling at a few hundred electron volts of kinetic energy. Thus, they carry enough momentum to displace lattice atoms from their normal position. This damages the surfaces and often, the optical and electrical properties of the substrate have been detrimentally changed.

Fabrication of ultra small electronic and optoelectronic devices requires dry etching processes that give high anisotropy, high selectivity between different materials, and minimal surface damage. Currently, ion enhanced plasma etching processes (e.g. reactive ion etching (RIE) and electron cyclotron enhanced RIE (ECR)) reliably create high aspect ratio nanometer scale features; however, etch induced damage has become increasingly troublesome as critical dimensions shrink. To minimize etch damage, reactive species generated in the plasma should have energies larger than the activation energy of the etch reaction (a fraction of an eV), but less than the energy required for atomic displacement (3 to 10 eV for III–V semiconductors). Given these limitations, the ion energies available in reactive-ion (about 300 eV) and electron cyclotron resonance plasma etching (about 50 eV) are not ideally suited for fabricating nanometer scale devices.

What is needed and was apparently not available until the presently described invention, is a method of etching that eliminates the damage inflicted by reactive-ion etching and yet achieves anisotropic etching.

A method of electron-impact-induced anisotropic etching of silicon (Si) by hydrogen is discussed in a 1982 article by S. Veprek and F. A. Sarott, "Electron-Impact-Induced Anisotropic Etching of Silicon by Hydrogen", Plasma Chemistry and Plasma Processing, Vol. 2, No. 3, p. 233. The authors discuss successful etch rates of up to 1,000 Å/min with little surface roughness at low temperatures. At higher temperatures a rougher pattern was seen. While their exact methodology is unclear, the authors apparently used an apparatus described in a previous publication by A. P. Webb and S. Veprek, "Reactivity of Solid Silicon With Hydrogen Under Conditions of a Low Pressure Plasma", Chemical Physics Letters, Vol. 62, No. 1, p. 173 (1978). That publication describes an apparatus including a DC glow discharge device with the sample immersed in the positive column. The cathode was a standard hot cathode (heated to between 1500–2000 K) having a tungsten filament coated with thorium oxide. While this technique apparently worked for etching Si(111) with hydrogen, it would not work using other reactive gases such as oxygen, chlorine, and fluorine because the hot filament would be immediately consumed. Furthermore, the apparatus described by Veprek and Sarott is cumbersome.

Other experiments, reported by Gillis et al. in an article entitled "Low-Energy Electron Beam Enhanced Etching of Si(100)—(2×1) by Molecular Hydrogen," J. Vac. Sci. Technology B 10(6), November/December, p. 2729 (1992), focused on flooding Si with low energy electrons (200–1000 eV) produced by an electron gun. The authors reported etching at a rate of about 100 Å/min with low damage to the Si surface. Other papers by the present inventors are: "Low Energy Electron—Enhanced Etching of Si(100) in Hydrogen/Helium Direct—Current Plasma", (Gillis et al., Appl. Phys. Lett., Vol 66(19), p. 2475 (1995)); "Low Energy Electron—Enhanced Etching of GaAs(100) in a Chlorine/Hydrogen DC Plasma" (Gillis et al., Appl. Phys. Lett., Vol. 68(16), p. 2255 (1996)); and "Low Energy Electron-Enhanced Etching of GaN in a Hydrogen DC Plasma" (to be published in J. Electrochem. Soc. November 1996). These publications are incorporated herein by reference, in their entireties.

SUMMARY OF THE INVENTION

The present invention involves low energy electron enhanced etching (LE4), as opposed to reactive ion enhanced etching. The process gives straight side walls, and it does not damage the substrate. In contrast to the above-described reactive ions, the low energy electrons that are used in the present invention travel at less than about 100 electron volts (eV) kinetic energy (KE), preferably at less than about 20 eV. The mass of electrons is many orders of magnitude smaller than the mass of ions and the electrons carry essentially no momentum to the surface. Therefore, they do not damage the surface.

The present invention provides a low damage alternative to ion enhanced processes, using low energy electron enhanced etching (LE4), in which the substrate sits on the anode of a DC glow discharge. The energy of electrons and negative ions arriving at the substrate on the anode of a DC discharge is limited to a value not greater than the ionization potential of the reaction gas; energies above this limit are effectively dissipated by inelastic collisions in the gas phase. No such fundamental limit is imposed on the positive ions produced in RF and microwave plasmas.

In one aspect, the invention involves a process for low-damage, anisotropic etching of a substrate that includes the steps of placing the substrate on the anode of a direct-current plasma reactor and subjecting the substrate to a plasma including low energy electrons and a gaseous species that is reactive with the substrate. The substrate can be a Group IV semiconductor, a Group III–V semiconductor, a Group II–VI semiconductor, an oxide, a nitride, a metal, or an alloy or mixture of the foregoing. The reactive species can be any that reacts with the substrate and that volatilizes within the temperature and flow of the device. Typical reactive species to be used are hydrogen, halogens, interhalogen compounds, hydrogen halides, and volatile organic compounds.

The low energy electrons are generated using a cold cathode. A voltage of about 0.5–2 kV is applied between the cathode and the anode, generating a glow discharge in which electrons having a kinetic energy of less than about 100 eV, or, preferably less than about 20 eV arrive at the anode.

In another aspect, the invention is an apparatus for conducting low-energy anisotropic etching of a substrate. The apparatus includes a chamber formed by a pair of connected tubes, at an angle from one another. The chamber is, of course, able to be placed under a vacuum. A cathode is in one tube and an anode is in the other, so that the anode is located at an angle of about 30° to 120° or, preferably, about 90° from the cathode. The cathode is a cold cathode, capable of generating a DC glow discharge in which low energy electrons having a kinetic energy of less than 100 eV, or preferably less than about 20 eV arrive at the anode. The cathode has one end that can be connected to a power supply that is preferably located outside the tube. The anode has means for mounting the substrate thereupon. Preferably, the anode and the substrate are surrounded by dielectric shielding to prevent plasma from "jumping" to alternative electrodes. The shield includes an aperture, the size and shape of which determine the area of the sample exposed to plasma. The apparatus further includes means for introducing the reactive gas into the sealed chamber.

In a preferred embodiment, the cold cathode is a hollow cathode formed with permeable, meshed, or perforated, generally referred to as permeable, walls rather than the typical solid walls. The cathode, in a preferred embodiment, may be cylindrically shaped with a side wall of a permeable conductive material, such as stainless steel mesh, and having one end that is open or closed and an open end. The cathode is connected to a cathode mounting post and to the power supply. The cathode may comprise a plurality of nested side walls, each connected to the power supply. The use of this cathode allows the generation of a large flux of low energy electrons at low pressure and temperature.

An advantage of the method and apparatus of the present invention is that low damage sub-micron anisotropic etching of a substrate is achieved.

Another advantage of the method and apparatus of the present invention is that it is applicable to a variety of substrates using a variety of reactive species.

Another advantage of the method and apparatus of the present invention is that the apparatus is fairly simple to assemble and operate.

Another advantage of the method and apparatus of the present invention is that the permeable wall hollow cathode can generate a higher flux of low energy electrons, at a lower pressure.

Other features and advantages of the method and apparatus of the present invention will become apparent to one with skill in the art upon examination of the drawings and the detailed description.

BRIEF DESCRIPTION OF THE DRAWINGS

The present invention can be better understood with reference to the following drawings. The drawings are not necessarily to scale, emphasis instead being upon clearly illustrating principles of the present invention.

DETAILED DESCRIPTION OF THE PREFERRED EMBODIMENT

Figure 1:
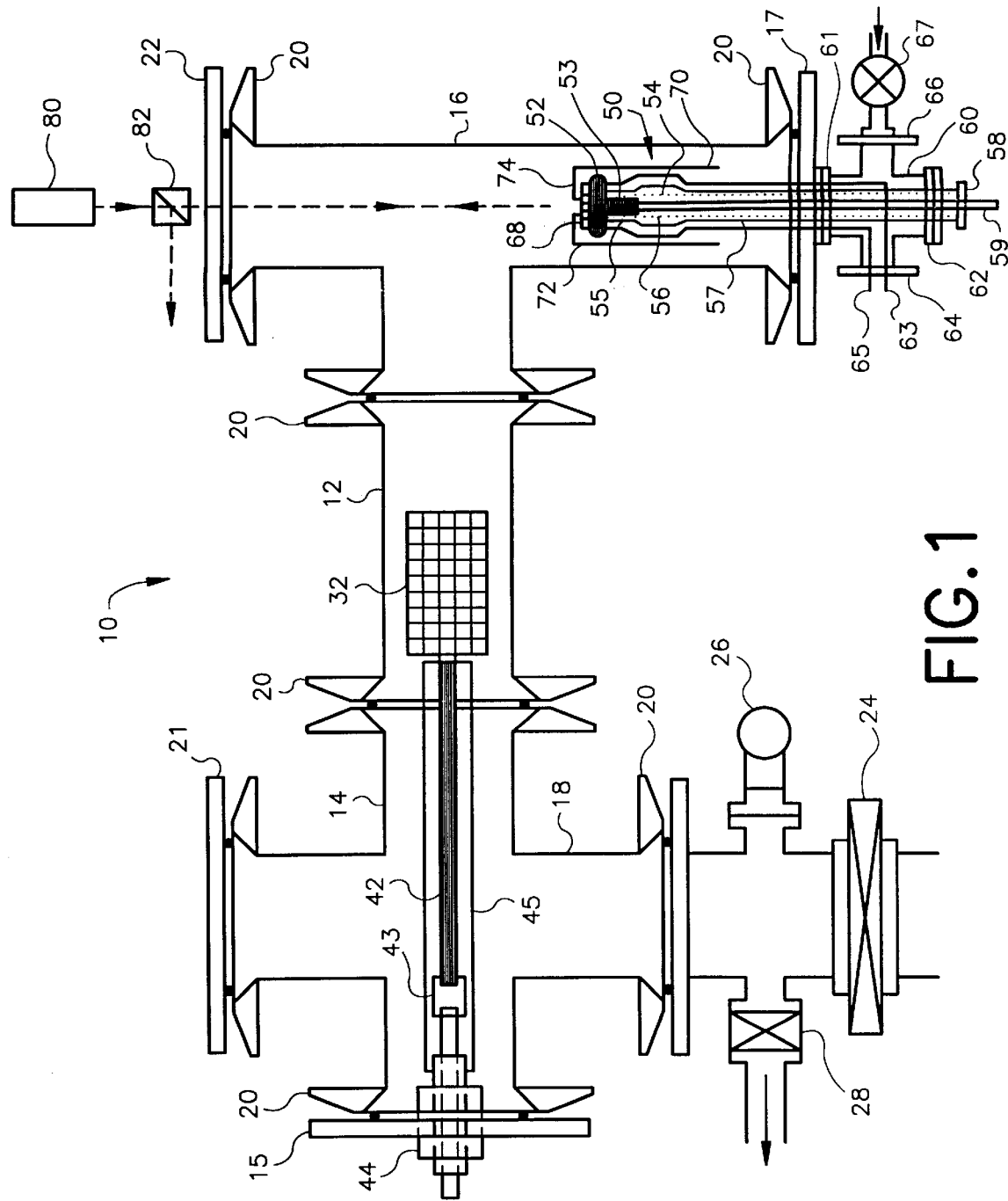
FIG. 1 is a top plan view of an apparatus of the present invention.

A preferred embodiment of an etching apparatus suitable for practicing the present invention, referred to generally as 10, is illustrated in FIG. 1. The apparatus includes a chamber 12 made of one or more adjoined 2" to 4" diameter PYREX™ glass pipes. Alternatively, larger hardware could be used to accommodate work pieces having diameters of 100–150 mm, or more. As shown in FIG. 1, the device 10 includes three sections: the cathode containing section 14, the anode containing section 16, oriented at 90° from the cathode containing section, and a third section 18, located near the cathode and also at 90° from the cathode containing section. The chamber can be set up having various configurations, an important aspect is that the anode containing section be at an angle, preferably at about 30° to about 120°, most preferably about 90°, from the cathode containing section so that the cathode material is not sputter deposited onto the anode or the substrate.

A plurality of clamps 20 are employed to hold sections of the chamber together and for clamping end plates to the chamber. End plate 15 is clamped to one end of cathode containing section 14. End plate 21 is preferably made of glass and serves as a view port to cathode containing section 14. End plate 22 is also preferably made of glass and serves as a view port to the sample, as described below. End plate 17 seals the other end of anode containing section 16.

The third section 18 provides access to the chamber for a pair of pump members. A gate valve 24 is connected to a ultra high vacuum (UHV) pumping station (not shown) and a butterfly valve 28 is connected to a rotary vane pump (not shown). A barocell manometer 26 monitors the pressure in the system. The UHV pump should be able to achieve and maintain hold a base vacuum of down to about $10^{-8}$ Torr on the chamber. The rotary vane pump should be able to achieve and maintain a vacuum of about 0.025 to 2 Torr during the etching process. Of course, one pump can be used if it is able to achieve and regulate the before-listed vacuums.

The cathode 32 is mounted in the cathode containing section 14. The cathode 32 is preferably a cold cathode, sometimes referred to as a field emission cathode, meaning it functions without the application of heat. The cathode is activated using an external power source (not shown) that applies a direct current (DC) voltage between the cathode and the anode. Because the chamber contains a gas (described below), the chamber functions as a DC glow-discharge tube or DC plasma reactor.

Figure 2:
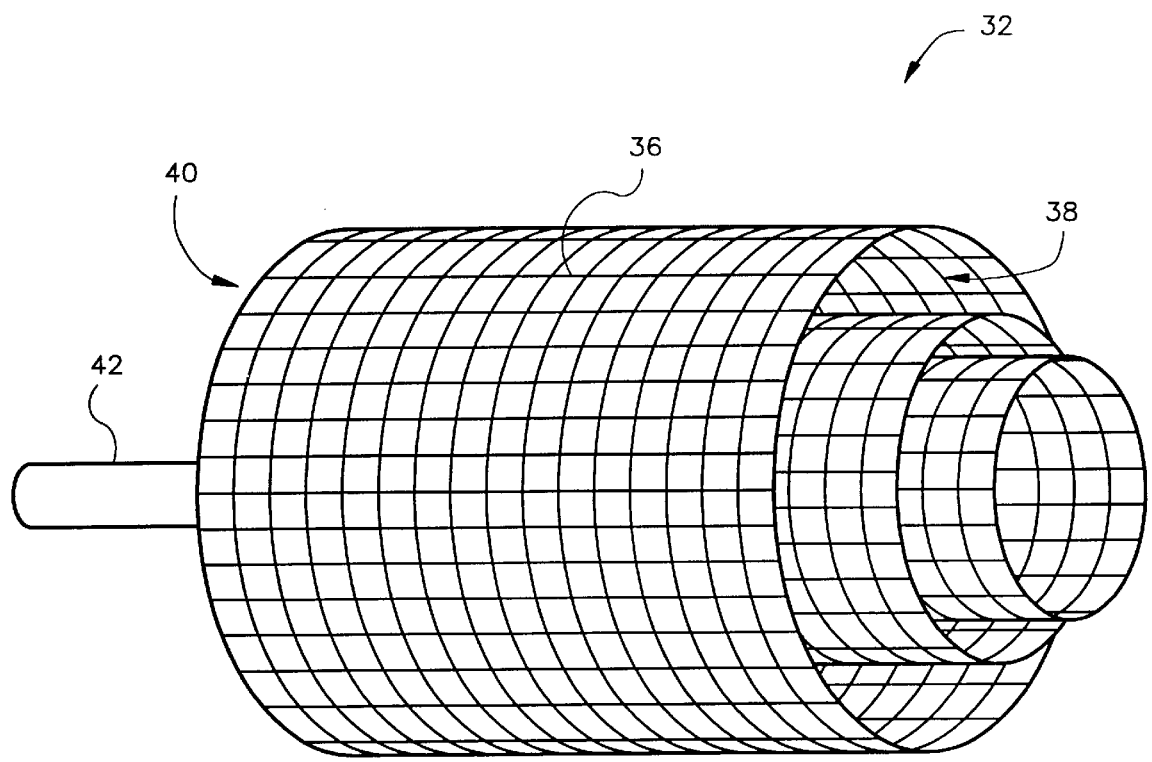
FIG. 2 is a perspective view of a permeable wall hollow cathode of the present invention.

The cathode may be a standard cold cathode such as are known in the art. Preferably, however, the cathode is a permeable wall hollow cathode of the present invention, more clearly illustrated in FIG. 2. Cathode 32 includes a tubular wall 36 made of a permeable, meshed, or perforated conductive material such as stainless steel mesh. The wall can have a variety of shapes, the cathode shown in FIG. 2 is designed to fit in a cylindrical cavity such as cathode containing section 14 of chamber 12 of the apparatus shown in FIG. 1. The cathode has two ends, a first, open, end 38 facing the anode containing section of the chamber, and a second end 40. The second end can be open or closed with an end piece (not shown). The end piece may be a solid piece of material or made of the same meshed material. Other materials such as aluminum may be preferred for the cathode material and the cathode may be coated with gold or other conducting material. Different materials may be preferred for different reactive gases. An important aspect is that the material should not react with or interfere with the reactive gas.

A mounting post 42 is attached to the cathode for mounting the cathode within the chamber. The mounting post may be attached to the end piece as described below. However, the mounting post can be attached to the wall 36 or alternative mounting means can be employed. Mounting post 42 is a metal rod having one end attached to the cathode and a second end attached to a coupler 43. Preferably, the second end threads into coupler 43. The coupler connects mounting post 42 to a high voltage feed-through 44, which passes through end wall 15 and is connected to the external power supply. Of course, the point where the feed-through 44 passes through end wall 15 is maintained air-tight. The method of connecting the cathode to the power supply, and the high voltage feed through, are standard to the art. A glass tube 45 encloses mounting post 42 and coupler 43 and shields the metal mounting post from electrons. The length of mounting post 42 is adjustable so that cathode 32 can be moved closer to or further from the anode. This can be done by replacing the post 42 with a post of another length or by using a telescoping-type post.

The cathode used in the present invention can be a single-walled permeable wall hollow cathode or may include a plurality of nested, similarly shaped structures, all having permeable walls, as shown in FIG. 2. Plasma current is increased even more with such a design.

A cathode according to the present invention can be made as follows. A length of stainless-steel mesh is wrapped around a mandrel having the desired shape (such as cylindrical). The length of mesh is cut to size, so that it has two adjoining edges running lengthwise of the mandrel. The two edges are spot welded or otherwise fastened together. One end of the shaped wire mesh tube is shaped into a cone by hand and attached to the first end of the mounting post by welding or crimping. The mandrel is removed.

The nested, permeable wall hollow cathode, shown in FIG. 2, can be made by fashioning a set of cylinders of varying diameters. A solid stainless plate is welded to the mounting post. The cylindrical walls are concentrically welded to the other side of the plate, beginning with the smallest diameter cylinder.

While specific ways of making a cathode in accordance with the invention are described, it should be understood that alternative ways are anticipated. For example, the cathode could have two open ends and the cathode mounting post could be attached along the cathode wall.

The presently disclosed cathode allows the operating voltage of the apparatus to be decreased by at least 2-fold because of its greater electron emitting surface area. The permeable walls allow the free flow of plasma and improve operating parameters such as pressure, temperature, and plasma stability.

While the inventive cathode is disclosed specifically for use in the presently discussed etching method and apparatus it should be appreciated that it has utility in other applications in which cold cathodes are used. For example, the inventive cathode may prove advantageous for use in gas lasers, and glow discharge lighting such as for advertising, illumination, and decoration.

The anode assembly 50 is mounted in the anode containing section of the chamber. The anode assembly includes a solid upper anodic disk 52 connected to a cylindrically shaped hollow support 53. A hollow cylindrically shaped support tube 54 supports the anode and includes an upper portion 55 made of stainless steel which has one end connected to the anodic disk 52 and a second end attached to an intermediate portion 56 which is made of ceramic and functions as a ceramic break. The lower portion 57 is made of stainless steel and has one end attached to the ceramic break 56 and the lower end attached to an end plate 58.

A sample heater 59 extends through end plate 58, the support tube 54 and into hollow support 53. In the preferred embodiment, heater 59 is a resistive cartridge heater measuring about ¼" diameter by about ½" length. By heating the hollow support 53 and the anodic disk 52, the heater also heats the sample.

In some cases, it may be desirable to cool the sample. This may be done by removing the heater 59 and flowing cold, dry nitrogen gas or liquid nitrogen fluid through the hollow support tube 54.

Support tube 54 exits chamber 12 through an aperture in end wall 17. Support tube 54 then passes through a gas manifold 60 that is in communication with chamber 12. Since manifold 60 is in communication with chamber 12 it must also be able to hold a base vacuum down to about $10^{-8}$ Torr. Thus, all of the manifold ports must be air-tight. Manifold inlet port 61 connects manifold 60 to chamber 12. Outlet port 62 allows passage of support tube 54 from manifold 60.

A thermocouple 63 passes through port 64, through manifold 60, into chamber 12 and attaches to anodic disk 52. The thermocouple measures the temperature of the anodic disk. An electrical lead 65 passes through port 64, through manifold 60, into chamber 12 and attaches to anodic disk 52. This lead may be used to maintain the anode at, for example, ground potential.

Because the apparatus as described includes the anodic assembly horizontally placed, the sample must be retained on the anodic disk. Also, it is desirable to cover the anodic disk and a portion of the anodic assembly with a dielectric shield to prevent the discharge current from contacting the metallic anodic disk and support tube. The dielectric shield is also used to retain the sample on the anodic disk.

The dielectric shield 70 is made of PYREX™ glass and includes a cylindrical wall 72 enclosing a portion of the anodic assembly and a bottom portion 74 overlying the anodic disk 52 and substrate 68. The bottom portion 74 contains an aperture defining the substrate area exposed to the plasma. The area of the aperture should be selected so that the plasma reactor does not suffer from a loading effect during the etch process. For the small reactor described in the present embodiment, an aperture having an area of approximately 0.2 $cm^2$ proved to be useful. For larger reactors, an aperture is not necessarily required. Alternatively, an aperture can be employed which has the ability to be moved relative to the substrate being etched. This permits different portions of the substrate to be exposed to the plasma at different times. Such an arrangement has the capability of supporting large diameter wafers without causing any sort of a deleterious loading effect on the system.

The shield is retained in position by appropriate means. For example, the shield may be fastened with a number of springs to end plate 17. Three protruding ears are formed at equal spacing along the lip of wall 72. Three spatially corresponding fasteners, such as screws, are placed on end plate 17. A spring is then fastened between each ear and its corresponding screw.

The reactive species is supplied through gas entry port 66 into manifold 60. Leak valve 67 is used to adjust the flow rate of the gaseous reactive species. From the manifold, the gaseous reactive species is able to enter chamber 12. Of course, the gas can be introduced into the chamber by any regulated means. The reactive species may be molecular or atomic.

The entire anode assembly 50 can be removed from chamber 12 by removing clamp 20 holding end wall 17 to the anode containing section 16. After the anode assembly is removed, the substrate 68 can be mounted onto the anodic disk 52.

The apparatus includes means to view the substrate. These means are preferably a He/Ne laser 80 that passes through glass plate 22 and illuminates the substrate. A beam splitter 82 separates incoming from reflected light and transmits reflected light to the viewer.

In the present invention, the substrate is preferably a Group IV semiconductor, a Group III–V semiconductor, a Group II–VI semiconductor, a metal, a superconductor, or a polymer. Also, it is anticipated that alloys or mixtures of the foregoing can be used. Also, oxides and nitrides of the foregoing can be used. Examples of substrates are Si, SiC, GaAs, AlGaAs, AlN, gold, chromium, high $T_c$ superconductors, aluminum, tungsten, and platinum. In preferred embodiments, the substrate is Si, GaAs, or GaN. While the present description has employed the term substrate, it is apparent that the substrate comprises any workpiece, a portion of the workpiece, or a layer of the workpiece wherein the inventive etching method is being used. For example, the substrate being etched may be an epitaxial layer of single crystal silicon which has been deposited by chemical vapor deposition (CVD) over a raw silicon wafer. Alternatively, the substrate being etched may be a thin film of thermal silicon dioxide which has been grown on the wafer, or a thin film of silicon dioxide deposited on the wafer. Moreover, the substrate being etched may comprise a region of polycrystalline silicon, or a silicide, or a polycide. These and other substrates that are applicable to the inventive process are well known in the art and appropriate substrates can be easily selected by those of skill in the art.

Preferably, the substrate is patterned with a mask of the desired configuration, through methods known in the art. For example, a silicon dioxide ($SiO_2$) or silicon nitride mask may be laid down over the substrate using plasma enhanced chemical vapor deposition followed by photolithographic patterning and wet etching of the mask in a 1:6 buffered oxide etch. Other methods of laying down masks and other mask materials may be used as well. $SiO_2$ is particularly preferred because the present method is selective for substrate over $SiO_2$ at the conditions used.

The substrate may be chemically etched before being subjected to the presently disclosed etching process, to remove native surface oxides. This chemical etching can be done by methods known in the art such as dipping the substrate in a 10% HF solution for about 5 seconds. Other chemicals that can be used for etching are HCl and ammonium hydroxide.

As an illustration, in use, the substrate, preferably masked and pre-etched, is mounted on to the anode. The UHV pumping station is activated to achieve a pressure in the chamber of about $10^{-8}$ Torr. This pressure is maintained for about 2 hours at a temperature of about 150° C. in order to degas the system and remove all $H_2O$. In order to remove residual $SiO_2$ or other oxides from the substrate surface, the substrate can be annealed by heating at about 200° C. in pure $H_2$ plasma for about 10 minutes.

The gate valve is closed and the butterfly valve is opened and the leak valve is opened so that a pressure of about 0.025 to 2.0 Torr is maintained in the chamber. The sample temperature is regulated to the desired degree. Voltage within the range of about 0.5 to 2 kV is applied between the cathode and the anode to produce an electron current density up to about 0.5 $A/cm^2$. At the same time, reactive gas is fed into the anode containing portion of the device at a flow of about 5–60 sccm.

After etching is complete, power to the cathode is stopped, gas flow is stopped, and the vacuum is removed. The substrate is removed and is then available for evaluation of the etch rate and degree of anisotropy and further processing, if desired.

It should be noted that the above detailed description describes one preferred embodiment of the invention and is not intended to describe all possible embodiments of the invention. For example, it is envisioned that it would be useful to scale up the apparatus. In this case, operating parameters would be likely to change. In selecting the chamber or exposed sample size, one must follow the scaling laws set by the similarity principle of glow discharge physics in order to select new values of power, pressure, and geometry to maintain the correct current densities. In addition, gas flow rates should be chosen to avoid loading effects.

EXAMPLE 1

Si(100) samples were chemically etched in 10% HF before loading into the chamber. The etching cycle for each sample comprised these steps: (1) degas for two hours at 150° C. in UHV (about $10^{-8}$ Torr); (2) anneal for 10 min. at 200° C. in pure $H_2$ plasma to remove any residual thin oxide layer; (3) etch for a selected time at selected $H_2/He$ composition, process pressure, and discharge current, maintaining sample temperature at 60° C. which is known to be the temperature for highest reaction rate between Si(100) and H atoms. Heated silicon wafers downstream from the anode enhanced the reaction rate by facilitating removal of the reaction products by thermal decomposition of silane on the wafers. The $H_2/He$ composition ranged from 100% $H_2$ to 10% $H_2$. The pressure ranged from about 0.03 to 2.0 Torr. The discharge current density was about 0.1 to 0.5 $A/cm^2$. Gas flow was from about 5 to 50 sccm. Voltages within the range 0.5 to 2.0 kV applied between the cathode and the anode produced glow discharge current density up to 0.5 $A/cm^2$.

The integrated charge passing through the sample was recorded for subsequent calculation of the reaction yield. The etched feature, defined by the aperture in the dielectric shield above the sample, was examined by profilometry in order to determine the etch rate and to estimate the volume of the etched feature. This volume was multiplied by the density of Si to determine the number of Si atoms removed.

EXAMPLE 2

GaAs(100) substrates were patterned with $SiO_2$ masks by plasma enhanced chemical vapor deposition of a 3000 Å $SiO_2$ layer followed by photolithographic patterning and wet etching of the $SiO_2$ in a 1:6 buffered oxide etch. The substrates were etched at room temperature in 100% $Cl_2$, 100% $H_2$, and various $Cl_2/H_2$ mixtures. The process pressures were 25 to 75 mTorr. Gas flows of 10 to 30 sccm for chlorine and hydrogen were maintained. After LE4, the substrates were examined by profilometry to determine the etch rate, scanning electron microscopy (SEM) to determine surface morphology and anisotropy of the etch, and by energy dispersed X-ray spectral analysis to estimate surface composition.

EXAMPLE 3

The substrates were 1 micrometer thick GaN films grown by metal-organic molecular beam epitaxy (MOMBE) over a 50 nanometer buffer layer of AlN on a Si(100) substrate. The substrates were patterned by a deposition of a 0.2 micrometer $SiO_2$ film by plasma enhanced chemical vapor deposition in which test features of 3 micrometer to 50 micrometer widths were defined by a standard photolithographic technique. Before LE4, the substrates were dipped for five seconds in 10% HF solution and then immediately mounted on the anode of the etching device. The current density was kept constant at about 300 $mA/cm^2$ DC. The sample temperature was in the range 75° C. to 250° C. Typical process pressure was about 0.20 Torr with a gas flow rate of hydrogen of 60 sccm.

RESULTS

Si(100)

Etch rates above 2000 Å/min., yields approaching 0.02 silicon atoms/electron, with a resulting root mean square (RMS) surface roughness of 2–3 Å were achieved. The most effective etching was noted at intermediate electron energies, which corresponds to the pressure region 0.6–1.2 Torr for 100% $H_2$, 1.0–1.6 Torr for 50% $H_2$/50% He, and 1.2–1.4 Torr for 10% $H_2$/90% He.

The foregoing results can be explained by estimating the energy of the incident electrons, as a function of gas composition and pressure, and comparing the contribution of various electron-induced processes as the electron energy changes. Although the cross section for electron-enhanced etching of Si to produce silane ($SiH_4$) is not yet known, it is reasonably expected to reach threshold at a few eV. The threshold of electron-stimulated decomposition of silane is as low as 10 eV. Hence, at moderate electron energy, the net result is competition between electron-enhanced etching of the silicon surface and redeposition of silicon from electron induced decomposition of the etch product.

For 100% $H_2$, the reaction efficiency decreases when the energy of incident electrons exceeds 10 eV, where silane disassociation begins (pressure <0.6 Torr) and redeposition of etched material takes place. At the same time, at low electron energies, <5 eV (pressure>1.2 Torr), the yield decreases because the electron-stimulated reaction cross section decreases. Dilution of the process gas by helium shifts the equilibrium to higher energies.

Silane dissociation at electron energies above 10 eV causes not only a decrease in the reaction yield, but also a change in the quality of the etched surface. All samples etched at lower pressure (high electron energy) show surface roughness of about 300 nm and obvious signs of redeposition. By contrast, at higher pressure/low electron energy, the etched surfaces were mirrorlike in appearance with a root mean square (RMS) roughness of 2–3 Å.

It is believed that both (111)-oriented silicon and (110)-oriented silicon could be etched with similarly attractive results. Moreover, it is anticipated that polycrystalline silicon, amorphous silicon, and silicides could be etched using the inventive process. Typical applications in silicon-based technologies include patterning of sub-micron features on integrated circuits and etching of critical elements on silicon sensors and micro-machines.

GaAs(100)

Samples etched in pure chlorine at room temperature showed high etch rates but extremely rough surfaces. This result, seen earlier in ion-enhanced chemistry in $Cl_2$ plasma, is attributed to group III chloride residues caused by their low vapor pressure. Buildup of the residue is forestalled by adding hydrogen to the etch gas, which removes the Group III element as the more volatile hydride.

SEM micrographs were measured for GaAs samples etched at room temperature and 50 mTorr total pressure at various gas compositions: a) 30% $H_2$/70% $Cl_2$; b) 50% $H_2$/50% $Cl_2$; c) 75% $H_2$/ 25 % $Cl_2$; d) 100% $H_2$. The morphology of the etched surface improves dramatically as the partial pressure of hydrogen increases: from extremely rough surfaces, cracked sidewalls and extensive residues at high $Cl_2$ to very smooth surfaces and sidewalls at hydrogen concentrations exceeding 75%. The RMS surface roughness for several samples etched at >75% $H_2$ was determined by an atomic force microscope (AFM) in contact mode and found to be 3–5 Å (unetched samples had the same roughness).

Pure hydrogen LE4 of GaAs produced smooth surfaces and good anisotropy at etch rate 150 Å/min. In contrast, electron cyclotron resonance (ECR) in hydrogen plasma does not etch GaAs reproducibly and can cause surface roughening. Moreover, thermal H atoms do not etch GaAs; they remove As as $AsH_3$, but do not etch the Ga atoms. Clearly the electron-enhanced chemistry in LE4 follows a different reaction mechanism. In tests, small, high aspect ratio pillars were successfully produced. Their attractive appearance demonstrates the feasibility of etching nanometer-scale features in GaAs by LE4.

Throughout the full range of reactive gas composition, good anisotropy was observed for pressure<60 mTorr. The anisotropy deteriorates at higher pressure, with undercut (isotropy) becoming observable at 75 mTorr and with rounded sidewalls with pronounced undercutting at 150 mTorr. This trend is qualitatively explained by the pressure dependence of the thickness of the anodic sheath, where negative particles receive their final acceleration toward the sample surface. Etching becomes anisotropic when the electron velocity component normal to the sample surface becomes much greater than the mean velocity of the random motion with which electrons enter the anode sheath from the positive column. Similar arguments relate the anisotropy of ion-enhanced etching to the angular distribution of velocity vectors of the arriving ions.

The etch rate dependence on the hydrogen concentration, with total pressure held constant at 50 mTorr was measured. The etch rate decreases gradually from 3000 Å/min at 100% $Cl_2$ to 180 Å/min at 100% $H_2$ because of the lower reactivity of hydrogen radicals with GaAs. This allows the practitioner to trade-off between etch rate and surface quality. By choosing 75% $H_2$/25% $Cl_2$ one can etch GaAs(100) surfaces in LE4 with excellent anisotropy, stoichiometric composition, and RMS surface roughness 3–5 Å, at the entirely respectable rate of 250 Å/min, all at room temperature.

The temperature dependence of the etch rate for different gas compositions at pressure of 50 mTorr was measured for: a) 75% $H_2$/25% $Cl_2$, b) 100% $Cl_2$ and c) 100% $H_2$. With chlorine present in any concentration, the etch rate increases over 2 orders of magnitude between room temperature and 150° C., reaching spectacular values greater than 4.5 $\mu$m per min. For pure hydrogen the etch rate does not change significantly over the same temperature range.

GaN

Good anisotropy and high selectivity of GaN relative to the Si substrate were observed. Preliminary results indicated that GaN etches faster at elevated temperatures while the Si etch rate is negligible at temperatures greater than 150° C. There was a strong temperature dependence of the GaN etching rate in hydrogen plasma. In a series of GaN samples etched in a pure hydrogen plasma at 0.20 Torr pressure and 300 mA/cm$^2$ plasma current density, the etch rate increased from 70 Å/min at 50° C. to 525 Å/min at 250° C. But, at the high temperatures the surface became Ga-rich. For a GaN sample etched at 250° C. for 20 min., the beads of metallic Ga were clearly visible on the surface. Samples etched at temperatures lower than 100° C. (etch rate 100 Å/min.) did not reveal any metallic Ga beads. Auger spectra of samples before and after etching showed that samples etched at higher temperatures were gallium rich, while the stoichiometry of surface etched at lower temperatures was essentially the same as for unetched samples. For these Auger estimates, the relative intensities of the gallium $L_3M_{45}M_{45}$ line at 1068 eV and the nitrogen $KL_{23}L_{23}$ line at 384 eV were compared on samples before and after etching. Quantative Auger analysis was impossible because of the significant roughness inherent to thick GaN films.

By increasing processing temperature, the etch rate was greatly increased, but at the cost of degrading surface stoichiometry. Nonetheless, according to the measurements it is possible to etch GaN films in hydrogen plasma with a respectable etch rate of 200 Å/min, while maintaining surface stoichiometry.

In those cases where a higher etch rate is desirable, it is expected that the LE4 rate can be significantly improved by adding a small percentage of chlorine to the process gas mixture. For example, the above results with LE4 of GaAs shows that the best combination of stoichiometry and etch rate is achieved for 25% $Cl_2$/75% $H_2$ reactive gas composition.

It will be obvious to those skilled in the art that many modifications may be made to the preferred embodiments of the present invention, as set forth above, without departing substantially from the principles of the present invention. All such modifications are intended to be included herein within the scope of the present invention, as defined in the following claims.

The following is claimed:

1. A process for low-damage anisotropic dry etching of a substrate, comprising the steps:

placing a substrate on an anode of a direct current plasma reactor;

generating a direct current (DC) glow discharge with a cold cathode; and subjecting the substrate to a plasma from which electrons and at least one species reactive with the substrate impinge on the substrate, the anode and the cathode having a potential difference formed therebetween such that the electrons are compelled towards the anode and have a kinetic energy less than approximately 100 eV.

2. The process of claim 1, further comprising the step of selecting said substrate from the group consisting of Group III–V semiconductors, Group IV semiconductors, Group II–VI semiconductors, metals, alloys of the foregoing, superconductors, and polymers.

3. The process of claim 1, wherein said substrate comprises a Group III–V semiconductor.

4. The process of claim 3, further comprising the steps of selecting said Group III–V semiconductor from the group consisting of GaAs, AlGaAs, GaN, and AlN.

5. The process of claim 1, wherein said substrate comprises Si or SiC.

6. The process of claim 1, further comprising the step of selecting said reactive species from the group consisting of hydrogen, halogens, interhalogen compounds, hydrogen halides, volatile organic compounds, and mixtures thereof.

7. The process of claim 1, wherein said reactive species comprises hydrogen and chlorine.

8. The process of claim 1, further comprising the step of patterning the substrate by etching the substrate through openings in a mask.

9. The process of claim 1, wherein the step of subjecting the substrate to a plasma is conducted at a pressure of between about 0.03 Torr and about 2.0 Torr.

10. The process of claim 1, further comprising the step of wet chemical pre-etching the substrate prior to placing the substrate on the anode.

11. The process of claim 1, wherein the cold cathode is a permeable wall hollow cathode.

12. The process of claim 1, further including the steps of degassing the plasma reactor and annealing the substrate prior to subjecting the substrate to a plasma including low energy electrons.

13. The process of claim 1, further including the step of locating said anode at an angle of about 30° to about 120° from said cathode.

14. The process of claim 1, further comprising the step of selecting the substrate from the group consisting of gold, chromium, high $T_c$ superconductors, aluminum, tungsten, platinum, and alloys thereof.

15. A process for low-damage anisotropic dry etching of a Group III–V semiconductor, comprising the steps:

providing a direct current plasma reactor including a cathode and an anode;

placing the semiconductor on the anode of the direct current plasma reactor;

generating a direct current (DC) glow discharge with a cold cathode; and subjecting the semiconductor to a plasma from which low energy electrons and a species reactive with the semiconductor impinge on the semiconductor, the anode and the cathode having a potential difference formed therebetween such that the electrons are compelled towards the anode.

16. The process of claim 15, further comprising the step of locating said anode at an angle of from about 30° to about 120° from said cathode.

17. The process of claim 15, wherein said cathode is a permeable wall hollow cold cathode that is able to generate electrons having a potential energy of from about 1 eV to about 20 eV.

18. The process of claim 15, further comprising the step of patterning said semiconductor by etching said semiconductor through openings in a mask.

19. The process of claim 15, further including the steps of pre-etching the semiconductor prior to placing the semiconductor on the anode and annealing the semiconductor prior to subjecting the semiconductor to the plasma by subjecting the semiconductor to $H_2$ plasma at elevated temperature.

20. The process of claim 15, wherein the semiconductor is GaAs and the plasma includes electrons having a potential energy of below about 20 eV and a reactive species of about 25% chlorine and about 75% hydrogen.

21. The process of claim 15, wherein the semiconductor is GaN and further including the step of selecting the molecular species from the group consisting of chlorine, hydrogen, and mixtures thereof.

22. The process of claim 15, further including the step of placing a dielectric shield over the semiconductor having an aperture defining the area of the semiconductor to be subjected to the plasma.

23. The process of claim 1, further comprising the step of pre-etching and cleaning the substrate prior to etching the substrate using said plasma including low energy electrons.

24. The process of claim 22, wherein said aperture is movable with respect to said semiconductor.

* * * * *

UNITED STATES PATENT AND TRADEMARK OFFICE
CERTIFICATE OF CORRECTION

PATENT NO. : 5,882,538
DATED : March 16, 1999
INVENTOR(S) : Martin et al.

It is certified that error appears in the above-indentified patent and that said Letters Patent is hereby corrected as shown below:

Col. 5, line 38, after "chamber" insert --12--.
Col. 5, line 40, after "section" insert --16--.
Col. 5, line 42, after "section" insert --14--.
Col. 5, line 45, after "chamber" insert --12--.
Col. 5, line 46, after "chamber" insert --12--.
Col. 5, line 48, after "to" insert --the--.
Col. 5, line 52, after "chamber" insert --12--.
Col. 5, line 58, delete "hold".
Col. 5, line 59, after "chamber" insert --12--.
Col. 5, line 67, after "cathode" insert --32--.
Col. 6, line 2, after "cathode" insert --32--.
Col. 6, line 3, after "chamber" insert --12--.
Col. 6, line 4, after "chamber" insert --12--.
Col. 6, line 6, after "cathode" insert --32--.
Col. 6, line 7, after "cathode" insert --32--.
Col. 6, line 12, after "cathode" insert --32--.
Col. 6, line 16, after "section" insert --16--.
Col. 6, line 16, after "chamber" insert --12--.
Col. 6, line 17, after "end" insert --40--.
Col. 6, line 27, after "cathode" insert --32--.
Col. 6, line 27, after "chamber" insert --12--.
Col. 6, line 29, after "post" insert --42--.
Col. 6, line 29, after "to the" insert --tubular--.
Col. 6, line 31, after "cathode" insert --32--.
Col. 6, line 33, after "coupler" insert --43--.

UNITED STATES PATENT AND TRADEMARK OFFICE
CERTIFICATE OF CORRECTION

PATENT NO. : 5,882,538
DATED : March 16, 1999
INVENTOR(S) : Martin *et al.*

It is certified that error appears in the above-indentified patent and that said Letters Patent is hereby corrected as shown below:

Col. 6, line 35, replace "wall" with --plate--.
Col. 6, line 37, replace "wall" with --plate--.
Col. 6, line 41, after "post" insert --42--.
Col. 7, line 18, after "section" insert --16--.
Col. 7, line 18, after "chamber" insert --12--.
Col. 7, line 18, after "assembly" insert --50--.
Col. 7, line 26, replace "ceramic break" with --intermediate portion--.
Col. 7, line 39, replace "wall" with --plate--.
Col. 7, line 49, after "thermocouple" insert --63--.
Col. 7, line 49, after "disk" insert --52--.
Col. 7, line 56, after "disk" insert --52--.
Col. 7, line 57, after "disk" insert --52--.
Col. 7, line 59, after "tube" insert --54--.
Col. 7, line 60, after "disk" insert --52--.
Col. 8, line 23, after "chamber" insert --12--.
Col. 8, line 27, replace "wall" with --plate--.
Col. 14, line 36, delete "molecular".

Signed and Sealed this

Twelfth Day of October, 1999

Attest:

*Attesting Officer*

Q. TODD DICKINSON

*Acting Commissioner of Patents and Trademarks*